(12) United States Patent
Ezaki et al.

(10) Patent No.: US 8,754,490 B2
(45) Date of Patent: *Jun. 17, 2014

(54) ELEMENT ARRAY WITH A PLURALITY OF ELECTROMECHANICAL CONVERSION DEVICES

(71) Applicant: Canon Kabushiki Kaisha, Tokyo (JP)

(72) Inventors: Takahiro Ezaki, Yokohama (JP); Chienliu Chang, Kawasaki (JP); Yasuhiro Soeda, Yokohama (JP); Kenji Tamamori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/906,672

(22) Filed: May 31, 2013

(65) Prior Publication Data

US 2013/0256817 A1 Oct. 3, 2013

Related U.S. Application Data

(62) Division of application No. 12/993,536, filed as application No. PCT/JP2009/062236 on Jun. 29, 2009, now Pat. No. 8,466,522.

(30) Foreign Application Priority Data

Jun. 30, 2008 (JP) ................................. 2008-171750
Feb. 12, 2009 (JP) ................................. 2009-029954

(51) Int. Cl.
  *H01L 29/84* (2006.01)
  *H01L 21/00* (2006.01)
  *B06B 1/02* (2006.01)
  *H01L 23/522* (2006.01)
  *H01L 27/12* (2006.01)
  *H01L 21/768* (2006.01)

(52) U.S. Cl.
  CPC .......... *B06B 1/0292* (2013.01); *H01L 23/5226* (2013.01); *H01L 29/84* (2013.01); *H01L 27/1203* (2013.01); *B81B 2201/0257* (2013.01); *H01L 21/76898* (2013.01)
  USPC ................... 257/416; 257/774; 257/E23.011; 438/50

(58) Field of Classification Search
  CPC ... B06B 1/0292; H01L 23/5226; H01L 29/84; H01L 27/1203; H01L 21/76898; B81B 2201/0257
  USPC ............ 257/204, 416, 419, 735, 774; 438/50, 438/53
  See application file for complete search history.

(56) References Cited

U.S. PATENT DOCUMENTS

| 6,430,109 B1 | 8/2002 | Khuri-Yakub et al. ........ 367/181 |
| 7,012,332 B2 | 3/2006 | Hori et al. ..................... 257/735 |

(Continued)

FOREIGN PATENT DOCUMENTS

| EP | 1 736 247 A1 | 12/2006 |
| JP | 2003-163996 A | 6/2003 |
| WO | WO 2007/099696 A1 | 9/2007 |

OTHER PUBLICATIONS

X. Zhuang et al., "Integration of Trench-Isolated Through-Wafer Interconnects with 2d Capacitive Micromachined Ultrasonic Transducer Arrays," *Sensors and Actuators A*, vol. 138, pp. 221-229 (Apr. 19, 2007).

(Continued)

*Primary Examiner* — Alonzo Chambliss
(74) *Attorney, Agent, or Firm* — Fitzpatrick, Cella, Harper & Scinto

(57) ABSTRACT

An element array comprises a plurality of elements having a first electrode and a second electrode with a gap therebetween; the first electrode is separated for each of the elements by grooves, an insulating connection substrate is bonded to the first electrode, and wirings are provided from the respective first electrodes through the connection substrate to the side opposite to the first electrodes.

19 Claims, 14 Drawing Sheets

(56) References Cited

U.S. PATENT DOCUMENTS

| | | | |
|---|---|---|---|
| 7,700,390 B2 | 4/2010 | Wang et al. | 438/31 |
| 8,288,192 B2 | 10/2012 | Chang | 257/419 |
| 8,466,522 B2 * | 6/2013 | Ezaki et al. | 257/416 |
| 2006/0125348 A1 | 6/2006 | Smith et al. | 310/309 |
| 2008/0048211 A1 | 2/2008 | Khuri-Yakub et al. | 257/204 |
| 2008/0194053 A1 | 8/2008 | Huang | 438/53 |
| 2008/0283493 A1 | 11/2008 | Tamamori et al. | 216/26 |
| 2009/0076393 A1 | 3/2009 | Adachi et al. | 600/459 |
| 2010/0107758 A1 | 5/2010 | Kandori et al. | 73/504.08 |
| 2010/0207484 A1 | 8/2010 | Chang | 310/300 |
| 2010/0327380 A1 | 12/2010 | Chang | 257/419 |

OTHER PUBLICATIONS

Office Action dated Dec. 2, 2011, issued by Chinese (P.R.C.) Patent Office in counterpart P.R.C. patent application 20098012410.7, with translation.

* cited by examiner

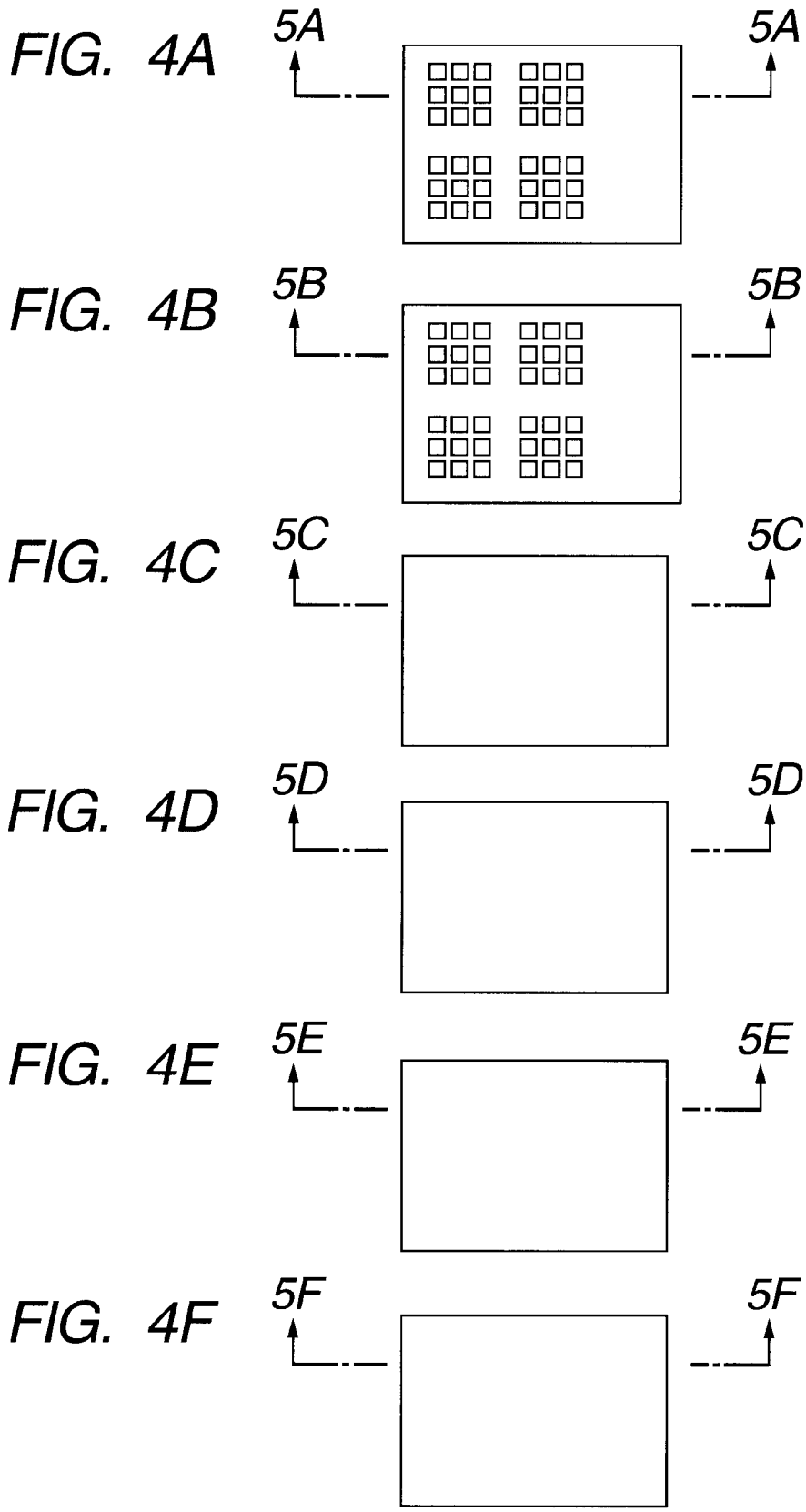

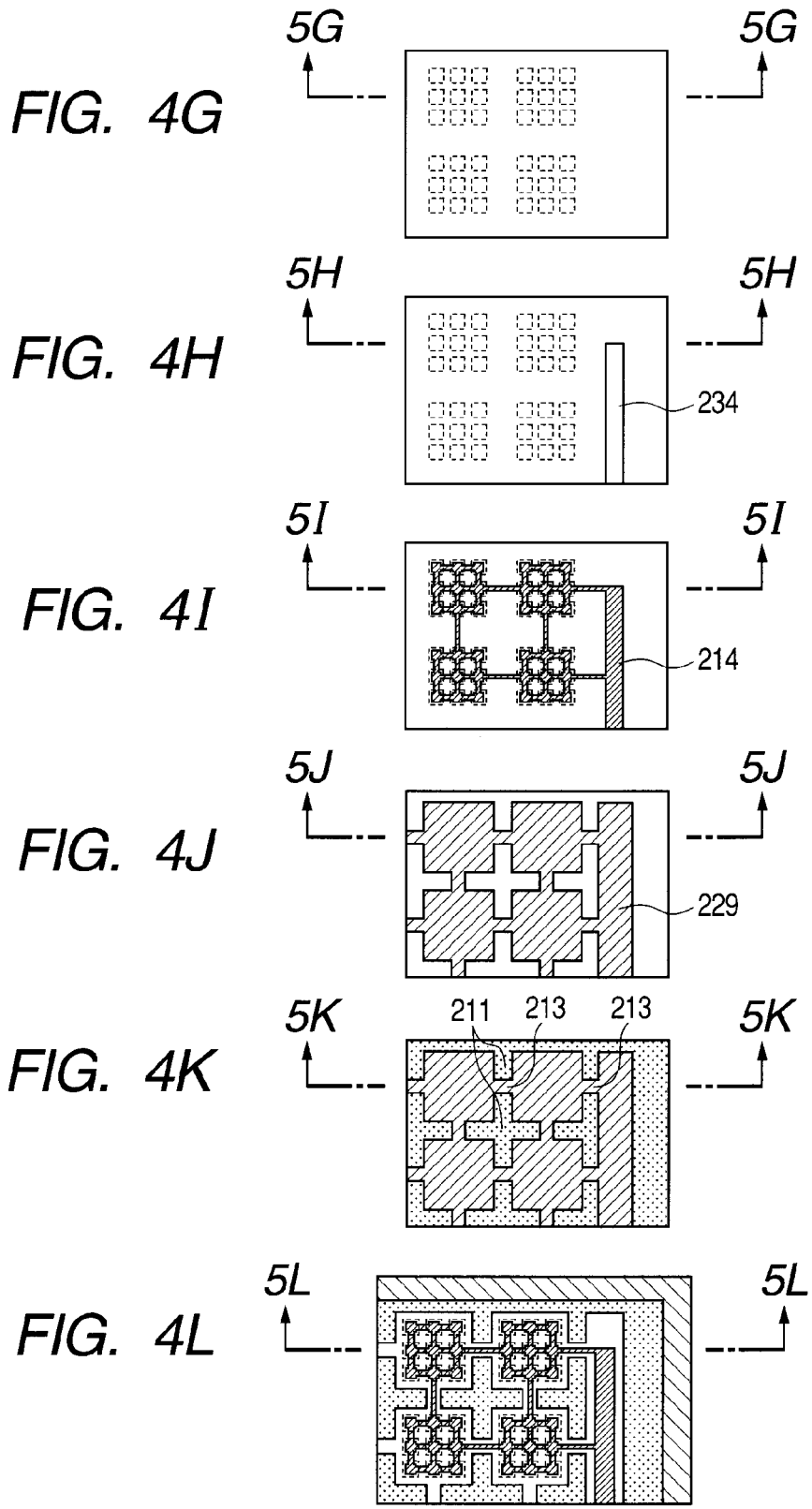

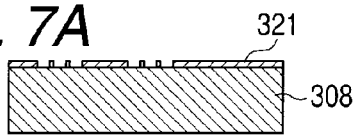
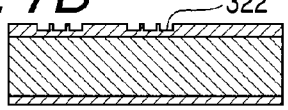
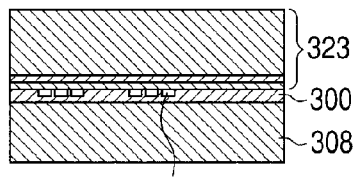
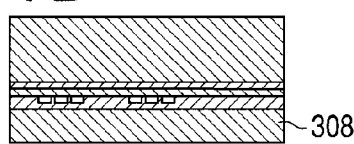
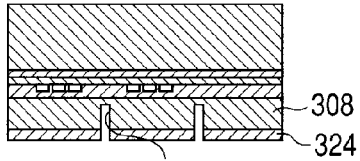
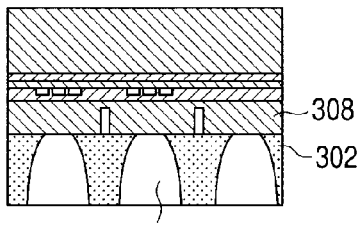
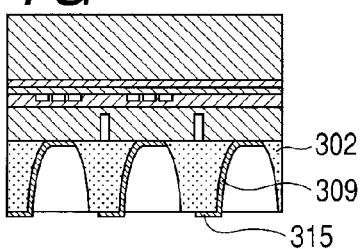
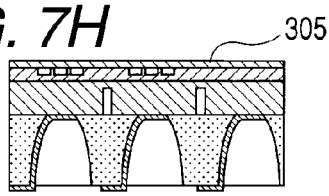
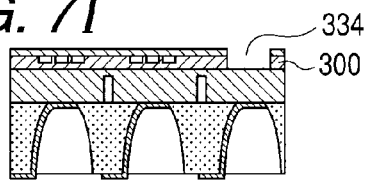
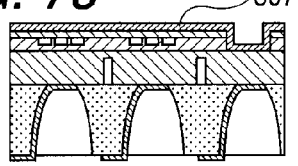
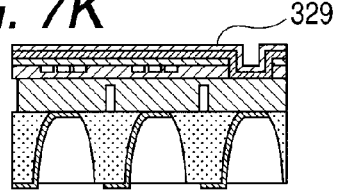
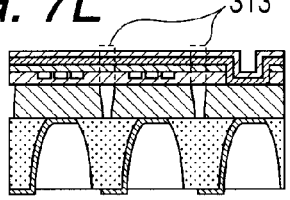
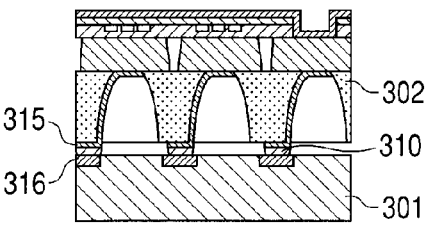

ELEMENT ARRAY WITH A PLURALITY OF ELECTROMECHANICAL CONVERSION DEVICES

RELATED APPLICATIONS

The present application is a divisional of Ser. No. 12/993,536, filed Nov. 19, 2010, which is a National Stage filing under 35 U.S.C. §371 of International Application No. PCT/JP2009/062236, filed Jun. 29, 2009, the entire disclosure of which is incorporated by reference herein. The present application also claims foreign priority under 35 U.S.C. §119 of Japanese Patent Application Nos. 2009-029954, filed Feb. 12, 2009, and 2008-171750, filed Jun. 30, 2008.

TECHNICAL FIELD

The present invention relates to an element array, an electromechanical conversion device, and a process for producing the electromechanical conversion device.

BACKGROUND ART

Electromechanical conversion devices such as an ultrasonic conversion device are used widely for transducing an electric signal to an ultrasonic wave and vice versa, and are useful as sensing probes for medical imaging or nondestructive inspection.

One type of such an electromechanical conversion device is a capacitive micro-machined ultrasound conversion device (CMUT). An example of a CMUT is constituted of an element substrate containing plural elements having a lower electrode, a membrane as a vibrator supported by a supporter placed on this substrate, and an upper electrode, and a circuit substrate connected electrically to the element substrate. This CMUT has a cavity as a gap between the substrate and the membrane. The CMUT emits an ultrasonic wave by vibrating the membrane by application of a voltage between the upper electrode and the lower electrode, or detects an ultrasonic wave by a change of the capacitance caused by vibration of the membrane on reception of an ultrasonic wave.

The element substrate can be produced by surface micromachining or bulk micromachining. In an example of the surface micromachining method, a silicon nitride film is formed as the membrane on a sacrificial layer on a substrate; an etching hole is bored therein; a cavity is formed by etching the sacrificial layer through the etching hole; and finally the etching hole is filled with silicon nitride to form a vacuum cavity. In an example of the bulk machining method, a cavity structure is formed on a silicon substrate, and thereto an SOI substrate (silicon-on-insulator substrate) is bonded. This method gives improved mechanical properties owing to mono-crystalline silicon used as the membrane.

A document, *Sensors and Actuators A* 138 (2007) 221-229 (hereinafter referred to as "Non-Patent Document 1") discloses a method in which membranes and cavities are formed two-dimensionally on a silicon substrate, and the silicon substrate itself is connected, as a lower electrode and wiring, to a circuit substrate. This method is described below with reference to FIG. 12. Element substrate 1007 is constituted of a plurality of elements. The element as a unit emits or receives an ultrasonic wave. One element 1008 is constituted of upper electrode 1000, membrane 1001, cavities 1002, support 1009, and lower electrode 1003. Grooves 1004 are provided to surround the respective lower electrodes to insulate the elements from each other to isolate the lower electrodes for the respective elements. Element substrate 1007 is connected to ASIC substrate 1006 ("application specific integrated circuit" substrate) through bumps 1005 as the electric contacts. The silicon substrate can be worked to form the lower electrodes and wiring lines at a high temperature without damage. Either surface micro-machining or bulk micro-machining can be employed for machining thereof.

DISCLOSURE OF THE INVENTION

The CMUT of the aforementioned non-patent document 1 employs a thin element substrate. Increasing the thickness of the lower electrode for higher mechanical strength of the element substrate can increase the parasitic capacitance. Further, grooves are formed on the silicon substrate as the lower electrode, leaving a thickness of about 1 μm including the supports and the vibrating membrane above the grooves. Therefore, the circuit substrate must be connected carefully in order not to damage the mechanically weak element substrate.

In view of the above problems, the present invention intends to improve the mechanical strength of the element substrate and to improve the production yield even when a thin lower electrode is used.

The present invention is directed to an element array comprising a plurality of elements having a first electrode and a second electrode with a gap therebetween, the first electrode being separated for each of the elements by grooves, an insulating connection substrate being bonded to the first electrode, and a wiring being made from each of the respective first electrodes through the connection substrate to the side opposite to the first electrodes.

The connection substrate can have through-holes for the wiring.

The first electrodes can be formed in one-to-one correspondence to the through-holes.

The wiring and the first electrode may or may not be coaxial.

The grooves can be shut by the connection substrate at the bonding interface between the first electrodes and the connection substrate.

The through-hole can expand from the bonding face with the first electrode through the connection substrate toward the opposite face.

The connection substrate can have a relative permittivity ranging from 3.8 to 10, a Young's modulus of not lower than 5 GPa, and a thermal expansion coefficient of not more than three times that of the element substrate.

The first electrode can be formed from a semiconductor material.

The first electrode and the connection substrate can be bonded by any of melt bonding, pressure bonding, anode bonding, direct bonding, and diffusion bonding.

The present invention is directed to an electromechanical conversion device comprising an element substrate having a plurality of elements having a first electrode and a second electrode with a gap therebetween, and a circuit substrate, in which the element substrate has grooves formed for separating the first electrodes for each of the elements, an insulating connection substrate is bonded to the first electrode to fix the element substrate and the circuit substrate with interposition of the connection substrate, and the first electrode and the circuit substrate are connected electrically by wiring provided through the connection substrate.

The present invention is directed to a process for producing an electromechanical conversion device which has a circuit substrate fixed to an element substrate having a first electrodes and a second electrode placed with a gap therebetween, comprising bonding, to the element substrate, an insulating connection substrate for electric connection of the first electrodes with the circuit substrate, forming grooves for separating the first electrodes for each of the elements on the element substrate bonded to the connection substrate, and fixing the connection substrate and the circuit substrate together.

The process for producing an electromechanical conversion device can comprise forming, in the connection substrate, a wiring for connecting electrically the first electrodes with the circuit substrate, and through-holes for forming the wiring.

In formation of the grooves, the grooves can be formed so as not to penetrate the first electrode before bonding the connection substrate to the element substrate, and portions of the grooves remaining can be removed after bonding of the connection substrate to the element electrode.

The present invention improves the mechanical strength of the conversion device by bonding a connection substrate as a reinforcing member to the element substrate. The present invention improves the production yield of the electromechanical conversion device by lowering the breakage ratio of the element substrate during the production process of the electromechanical conversion device.

Further features of the present invention will become apparent from the following description of exemplary embodiments with reference to the attached drawings.

BRIEF DESCRIPTION OF THE DRAWINGS

FIGS. 4A, 4B, 4C, 4D, 4E, 4F, 4G, 4H, 4I, 4J, 4K and 4L are plan views for describing a process for production of the CMUT of Embodiment 1.

FIGS. 7A, 7B, 7C, 7D, 7E, 7F, 7G, 7H, 7I, 7J, 7K, 7L and 7M are sectional views for describing a process for production of the CMUT of Embodiment 2.

BEST MODE FOR CARRYING OUT THE INVENTION

Preferred embodiments of the present invention will now be described in detail in accordance with the accompanying drawings.

A CMUT, an electromechanical conversion device, will be described to which the present invention is applicable. However, the present invention is not limited to such an electrostatic capacity type of ultrasonic conversion device, but is applicable to conversion devices having a similar structure, as well.

Figure 1A:
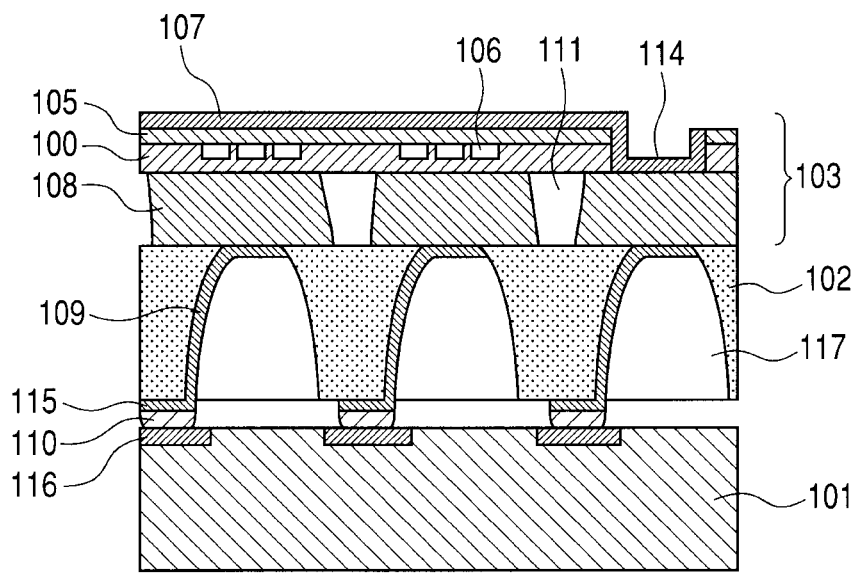
FIGS. 1A and 1B illustrate schematically a CMUT to which the present invention is applicable.
Figure 1B:
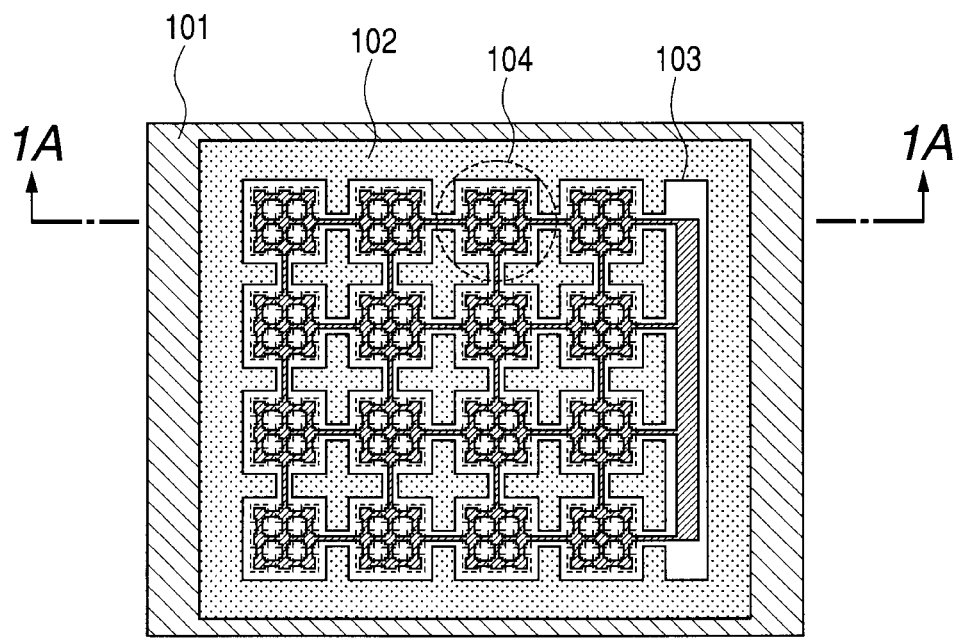

FIGS. 1A and 1B illustrate schematically a structure of a CMUT to which the present invention is applicable. FIG. 1A is a sectional view taken along line A-A' in FIG. 1B. FIG. 1B is a plan view of the CMUT. For ease of understanding, hatching is provided in the plan view also.

The CMUT of this embodiment is constituted of circuit substrate 101, connection substrate 102, and element substrate 103. In the present invention, a constitution comprising an element substrate and a connection substrate is called an element array, and a constitution comprising the element array and a circuit substrate is called an electromechanical conversion device. As illustrated in FIG. 1A, the element substrate and the circuit substrate are fixed to each other through the connection substrate, and the circuit substrate is placed below the element substrate, not on the same level (not side by side).

On element substrate 103, a plurality of elements 104 connected electrically with each other is arranged in two dimensions. Each of elements 104 is constituted of upper electrode 107 as the second electrode, membrane 105 as a vibrating membrane, support 100 made of an insulating material, and lower electrode 108 as the first electrode (the terms "first" and "second" being used to correspond to those terms elsewhere in the specification). Nine cavities 106 are formed as gaps between upper electrode 107 and lower electrodes 108. Lower electrodes 108 are separated by grooves 111 for each of the elements. In this Embodiment, nine cavities 106 are formed in each of elements 104. Such elements are arranged in four lines and four rows. The arrangement and the number of the elements are not limited to those of this embodiment, but may be provided in desired arrangement and in a desired number.

Through connection substrate 102, through-holes 117 are formed between the face bonding with the element substrate (first electrode side) and the face of the circuit substrate side (opposite to the first electrode side). Lower electrode lead-out wiring 109 is formed along the side wall of the respective through-holes. The signals from the lower electrode are transmitted through lower-electrode lead-out wire line 109 and connected lower-electrode pad 115 to circuit substrate 101. The signals from the upper electrodes are transmitted through the lower-electrode lead-out wiring directly below to circuit substrate 101. In the present invention, the wiring includes lower-electrode lead-out wiring lines 109 and lower-electrode pads 115 (other electrode pads 116 are also provided, as shown). In the present invention, the through-holes may be filled entirely with the wiring without leaving a space, insofar as the wiring for electrically connecting the lower electrode and the circuit substrate is formed.

Circuit substrate 101 has constituted of a processing circuit (not shown in the drawing) for processing signals, and electrode pads 115. The circuit substrate and the connection substrate are joined by bumps 110.

The principle of operation of a CMUT of such a structure is described below. On receiving an ultrasonic wave, membrane 105 is displaced to change the gap between upper electrode 107 and lower electrode 108. The resulting change of the electrostatic capacitance is detected and processed by the signal processing circuit on circuit substrate 101 to obtain an ultrasonic wave image. For emitting an ultrasonic wave, a voltage is applied from circuit substrate 101 to upper electrode 107 or lower electrode 108 to vibrate the membrane to emit an ultrasonic wave.

Figure 2A:
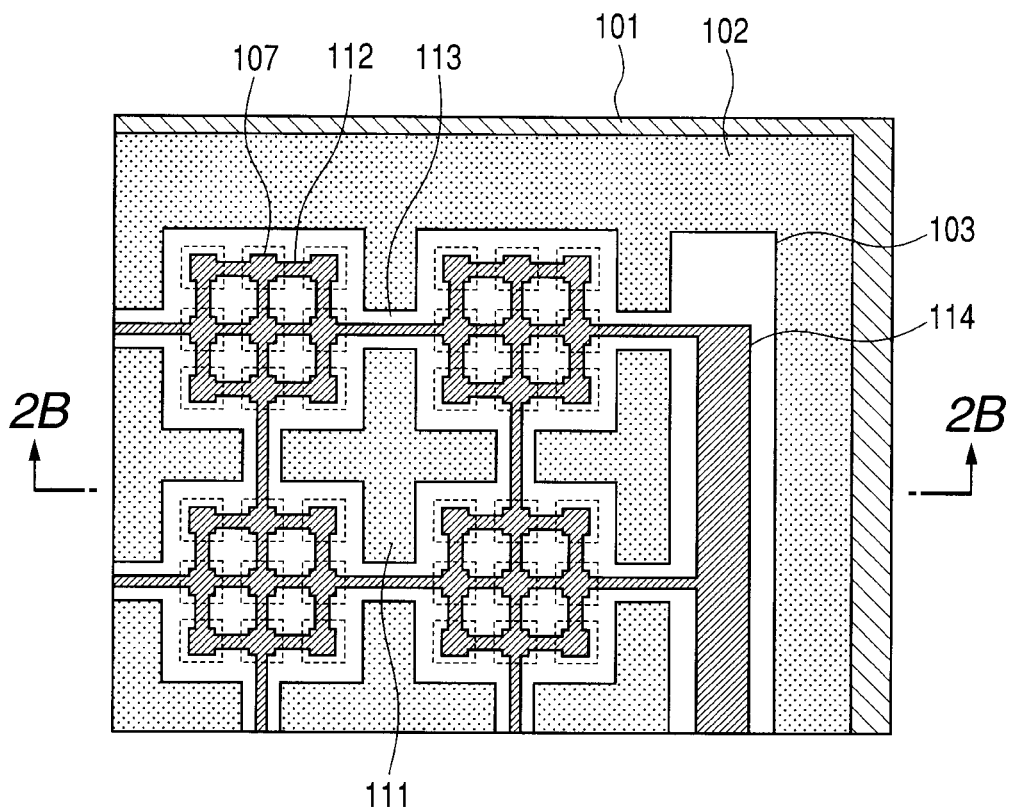
FIGS. 2A and 2B illustrate schematically another CMUT to which the present invention is applicable.
Figure 2B:
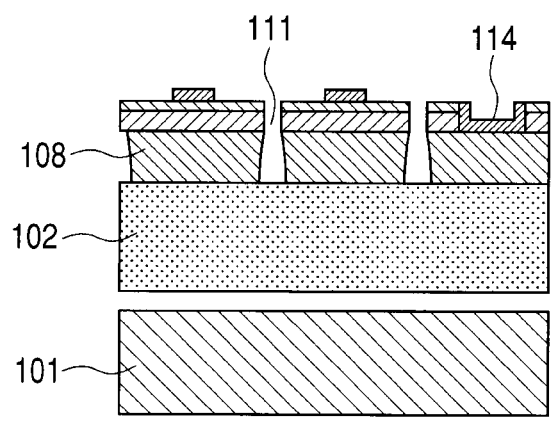

Next, element substrate 103 is described below in detail with reference to FIGS. 2A and 2B. FIG. 2A is a schematic enlarged view of a part of FIG. 1B. FIG. 2B is a schematic sectional view taken along line 2B-2B in FIG. 2A. Upper electrodes 107 of the elements formed on the membrane are connected electrically together by upper electrode wiring 112. The adjacent elements are connected electrically by upper electrode wiring 112 on beam 113 constituted of the membrane and the support. Finally, all the upper electrodes are connected to upper-electrode lead-out wiring 114. The upper electrodes are connected through upper-electrode lead-out wiring 114 and lower electrode 108 to the circuit substrate as illustrated in FIGS. 1A and 1B.

The upper electrode, the upper-electrode wiring lines, and the upper-electrode lead-out wiring lines may be formed from at least one of metals selected from Al, Cr, Ti, Au, Pt, Cu, Ag, W, Mo, Ta, and Ni; and alloys selected from AlSi, AlCu, AlTi, MoW, and AlCr. The upper electrode may be provided on at least one of the upper face, reverse face, and inside of the membrane, or a membrane formed from a conductive material or semiconducting material itself may be used as the upper electrode.

The lower electrode in the present invention is formed preferably from a semiconductor substrate like silicon which is readily workable finely. The resistivity of the lower electrode is preferably not higher than 0.02 Ω·cm, since the lower the wiring resistance of the lower electrode, the less loss of the signal will be caused.

The shape of the lower electrode (the shape in the plan view) is not limited, and may be formed in a desired shape, polygonal or circular, to correspond to the shape of the element.

The smaller the thickness of the lower electrode, the smaller is the parasitic capacitance between the adjacent lower electrodes and the lower is the wiring resistance. Therefore, the thickness of the lower electrode is preferably not larger than 1000 μm, more preferably not larger than 500 μm, still more preferably not larger than 100 μm.

The material of lower electrode 108 is removed from the regions other than the elements and upper-electrode lead-out wiring by formation of groove 111, and also from the regions of beam 113 as illustrated in FIG. 2A. Groove 111 penetrates through membrane 105 and support 100 at the portions of other than the elements and upper electrode lead-out wirings.

Figure 3:
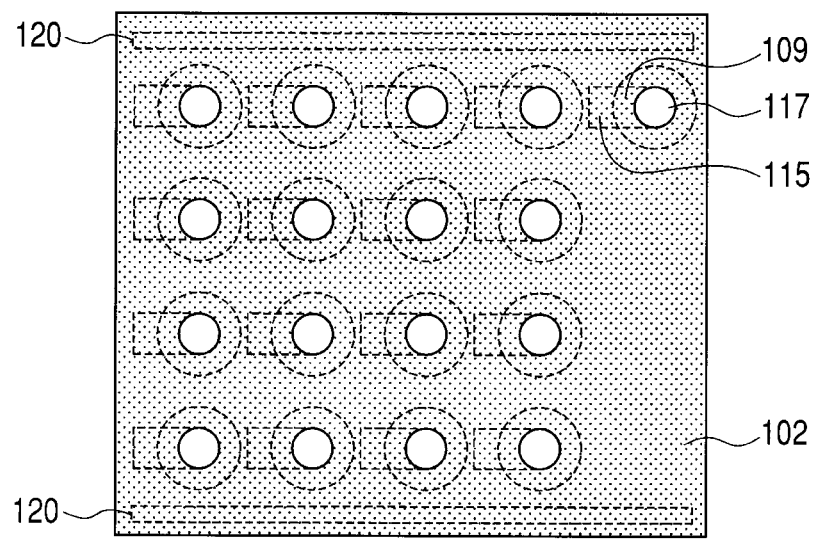
FIG. 3 illustrates schematically a connection substrate to which the present invention is applicable.

Connection substrate 102 is described below in detail with reference to FIG. 3. The connection substrate has through-holes 117. In through-holes 117, lower electrode lead-out wiring lines 109 are formed for connection with lower-electrode pads 115. The space of the through-hole may be filled with the wiring, provided that the wiring connects electrically the lower electrode with the circuit substrate. For increasing the strength of bonding between the connection substrate and the circuit substrate, adhesive 120 may be applied partly on the bonding interface.

The connection substrate is formed from an insulating material. The insulating material has preferably a relative permittivity ranging from 3.8 to 10, a Young's modulus of not lower than 5 GPa, and a thermal expansion coefficient of not more than three times that of the element substrate. The relative permittivity ranging from 3.8 to 10 ensures the preferred insulation performance. The young's modulus of not lower than 5 GPa raises the rigidity and improves the mechanical strength. The thermal expansion coefficient of not more than three times that of the element substrate decreases warpage of the electromechanical conversion device by the heat during the production process or during use thereof. Specifically, for an element substrate made of silicon (thermal expansion coefficient: 2.55-4.33 ppm/K), the connection substrate is preferably selected from borosilicate glass (thermal expansion coefficient: 3.2-5.2 ppm/K). Specific example of the connection substrate is a glass or a rigid print substrate. The print substrate formed from rigid insulating base material includes a paper-phenol substrate, a paper-epoxy substrate, a glass composite substrate, a glass epoxy substrate, a fluoro-resin substrate like Teflon®, an alumina substrate, and composite substrate.

The thickness of the connection substrate is preferably larger for sufficient mechanical strength. However, excessive thickness can cause excessive expansion of the diameter of the through-hole. The thickness ranges preferably from 50 μm to 1000 μm, more preferably from 80 μm to 500 μm, still more preferably from 100 μm to 200 μm.

The through-hole in the present invention penetrates through the connection substrate from the interface for bonding to the element substrate to the face of the circuit substrate side. The shape of the through-hole (that is, its shape as seen in a plan view) is not limited, and may be polygonal, circular, semicircular, or ellipsoidal.

The positions of the through-holes are not limited, but through-holes are preferably arranged at constant intervals in two-dimensions similarly as the arrangement of the elements for use of the electromechanical conversion device as two-dimensionally arrayed vibrators. The respective through-holes are preferably formed through the connection substrate not to communicate with two or more of the lower electrodes at the bonding interface between the element substrate and the connection substrate. The formation of one lower electrode for each one through-hole facilitates formation of the lower electrode lead-out wiring not cause cross-talk between the adjacent lower electrodes, and gives higher mechanical strength.

The through-holes are preferably expanded from the interface of bonding to the element substrate toward the circuit substrate side to facilitate formation of the wiring along the side face of the through-holes by vapor deposition.

In particular, in view of the mechanical strength, the through-holes are particularly preferably shifted horizontally from the grooves formed on the element substrate to shut the grooves with the connection substrate. Thereby the mechanically weak groove portions are supported to prevent breakage of the element substrate.

The through-hole has preferably a smaller diameter for higher mechanical strength. The diameter is selected in consideration of ease of working of the through-holes and the width of the element. Specifically the diameter ranges preferably from 10 μm to 2000 μm, more preferably from 10 μm to 1000 μm, still more preferably from 10 μm to 500 μm.

The interspace between the through-holes (pitch between adjacent through-holes) is decided suitably in consideration of the width of the element. The element has usually a width ranging from 50 μm to 3000 μm, so that the interspace between the through-holes ranges preferably from 50 μm to 3000 μm, more preferably from 10 μm to 500 μm, still more preferably from 50 μm to 100 μm.

The lower electrodes are bonded to the connection substrate preferably by melt bonding, pressure bonding, direct bonding, diffusion bonding or a like bonding method without application of an adhesive. An adhesive, if used for bonding the lower electrodes to the connection substrate, can penetrate into the grooves separating the lower electrodes. Generally, an adhesive has a dielectric constant higher than that of the air.

Therefore, the adhesive which has entered the groove can increase the parasitic capacitance at the lower electrode. The lower electrode has a very small sectional area ranging from about $1 \times 10^{-8}$ m$^2$ to about $1 \times 10^{-6}$ m$^2$. Therefore it is very difficult to apply an adhesive only to the bonding face between the lower electrode and the connection substrate or to form an adhesive film thereon.

The wiring line in the present invention is constituted of a conductive material connecting electrically the lower electrode with the circuit substrate, corresponding to lower electrode lead-out wiring 109 and lower electrode pad 115 as illustrated in FIGS. 1A and 1B. The material for the wiring includes metals of Al, Cr, Ti, Au, Pt, Cu, Ag, Fe, Ni, Co, W, and so forth, and alloys thereof. To prevent peeling of the wiring or prevent breakage of the connection substrate, the wiring material is preferably selected to make smaller the difference of the thermal expansion coefficients between the connection substrate and the wiring. For ease of formation of the wiring, the wiring is preferably formed partly on the side walls of the through-holes. Further, the wiring and the lower electrode are preferably formed on different axes to prevent break of the wiring by a tearing force generated by volume change between the lower electrode and the connection substrate in the thermal process during the production.

The connection substrate and the circuit substrate are connected through the electrode pads on the connection substrate and the electrode pads on the circuit electrode with interposition of the bumps. The electric signal from the lower electrode is transmitted through the wiring formed in the through-hole in the connection substrate to the circuit electrode. The bump is formed from at least one metal selected from Zn, Au, Ag, Cu, Sn, Pb, and the like metals. For stronger bonding, an adhesive may be used supplementarily. The adhesive may be applied to peripheral portions or may be formed thereon in a film state.

The element array, the electromechanical conversion device having the element array, and the process of its production of the present invention are described below in detail with reference to drawings.

Embodiment 1

This Embodiment 1 describes a CMUT utilizing bulk micromachining for formation of the membrane by bonding of an SOI substrate, and a process for production of the CMUT. The SOI substrate is constituted of a silicon substrate (hereinafter referred to as a "supporting substrate layer"), a surface silicon layer (hereinafter referred to as a "device layer"), and oxide layer (hereinafter referred to as an "embedded oxidized film layer"). This Embodiment employs material sold under the name Pyrex® as the connection substrate. The process flow of this Embodiment is described with reference to FIGS. 5A to 5L. FIGS. 5A to 5L are sectional views of two elements for describing the process flow, the other elements being produced in the same manner. FIGS. 4A to 4L are plan views and FIGS. 5A to 5L are sectional views of the elements illustrated in FIGS. 4A to 4L.

Figure 5A:
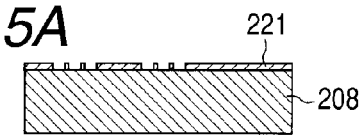
FIGS. 5A, 5B, 5C, 5D, 5E, 5F, 5G, 5H, 5I, 5J, 5K and 5L are sectional views for describing a process for production of the CMUT of Embodiment 1.

A Si substrate is prepared firstly. The Si substrate has preferably a lower resistivity for the use as the lower electrode. In this Embodiment, Si substrate 208 has a resistivity lower than 0.02 Ω·cm. An oxidized film 221 is formed on Si substrate 208. A resist pattern is formed thereon by photolithography for formation of a pattern of cavities. The oxidized film is etched by buffered hydrofluoric acid (BHF) by utilizing the resist pattern as a mask to form concaves for the cavities. Si substrate 208 has preferably a thickness ranging from 100 μm to 625 μm. The oxidized film 221 has a thickness of preferably not more than 2 μm for formation of the cavities. FIG. 4A is a plan view after formation of the cavity pattern, and FIG. 5A is a sectional view taken along line 5A-5A in FIG. 4A.

Figure 5B:
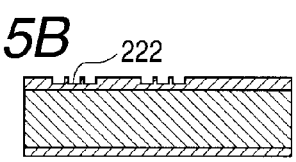

The Si substrate is again thermally oxidized for insulation of the bottoms of the cavities to form oxidized film 222 in a thickness, for example, of 1500 Angstroms. FIG. 4B is a plan view after formation of thermally oxidized film 222, and FIG. 5B is a sectional view taken along line 5B-5B in FIG. 4B. In this Embodiment, oxidized film 221 and oxidized film 222 constitute support 200.

Figure 5C:
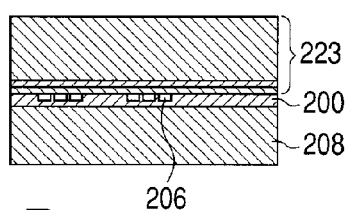

In the next step, SOI substrate 223 is bonded onto the substrate illustrated in FIG. 5B. FIG. 4C is a plan view after bonding of the SOI substrate, and FIG. 5C is a sectional view taken along line 5C-5C in FIG. 4C. This bonding step is conducted as below. Firstly, the device layer, which is the bonding face of Si substrate 208 to SOI substrate 223 is treated with plasma of any of $NO_2$, $O_2$, and Ar. Then Si substrate 208 and SOI substrate 223 are positionally registered by confronting the orifices or notches. Finally the substrates are bonded in a vacuum chamber, for example, at a temperature of 300° C. at a load of 500 N. Thereby cavities 206 are formed.

Figure 5D:
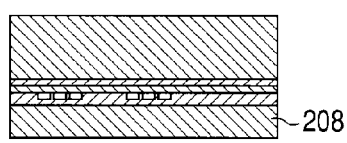

Si substrate 208 is made thinner by CMP (chemical mechanical polishing) or a like method. FIG. 4D is a plan view after Si substrate 208 is made thinner, and FIG. 5D is a sectional view taken along line 5D-5D in FIG. 4D. Si substrate 208 which will function as the lower electrode is made thinner for decreasing the resistance of the through-wiring.

Figure 5E:
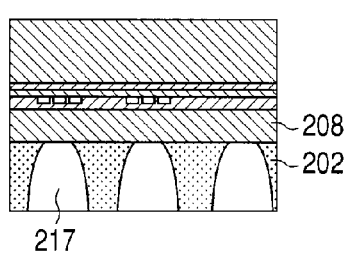

In the next step, Si substrate 208 prepared above as illustrated in FIG. 5D and Pyrex® substrate 202 to be used for the connection substrate are bonded together by anode bonding. FIG. 5E is a sectional view after the bonding of Pyrex® substrate 202. In Pyrex® substrate 202, through-holes 217 are preliminarily formed by sand blasting or a like method. The through-holes are positionally registered to have the center axes at the same positions as the center axes of the elements. The registration can be made with precision of at least ±5 μm by use of a conventional alignment apparatus (e.g., EVG620 produced by EVG Co.).

Figure 5F:
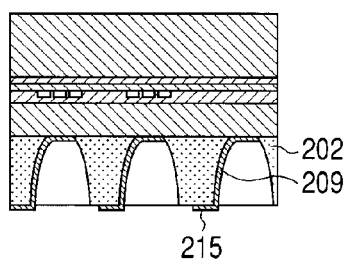

In the next step, lower-electrode lead-out wiring 209 and lower electrode pads 215 are formed in and on Pyrex® substrate 202. FIG. 4F is a plan view after the wiring film formation, and FIG. 5F is a sectional view taken along line 5F-5F in FIG. 4F. In this step, a metal mask having a pattern for lower-electrode lead-out wiring 209 and lower electrode pads 215 is placed on the front side of Pyrex® substrate 202, and lower-electrode wiring lines 209 and lower electrode pads 215 are formed in a film shape by vapor deposition. In this Embodiment, Ti/Cu/Au is vapor-deposited an angle of 45° relative to the center axes of the through-holes not to cause disconnection at the corner portions of through-holes 217. Thereby, lead-out wiring 209 and lower electrode pads 115 are formed in and on Pyrex® substrate 202.

Figure 5G:
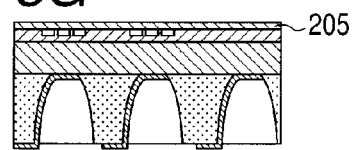

In the next step, the supporting substrate layer and the embedded oxidized film layer on SOI substrate 223 are removed by etching. For example, the supporting substrate layer of SOI substrate 223 is removed by etching by deep-RIE, and the embedded oxidized film layer is removed by etching by BHF to form membrane 205. FIG. 4G is a plan view after etching removal of the supporting substrate layer and the embedded oxidized layer, and FIG. 5G is a sectional view taken along line 5G-5G in FIG. 4G.

In the next step, portion 234 for the upper-electrode lead-out wiring is formed. On the membrane formed as illustrated in FIG. 5G, a resist pattern for portions 234 for the upper-electrode lead-out wiring is formed by photolithography.

Figure 5H:
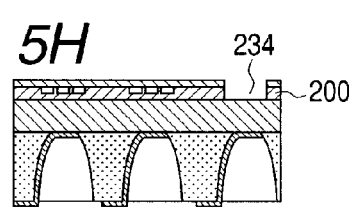

With this resist as the mask, membrane 205 is dry-etched with a $CF_4$ gas or a $SF_6$ gas. In the same manner, with a resist as the mask, support portion 200 is dry-etched by a $CF_4$ or $CHF_3$ gas. FIG. 4H is a plan view after formation of the portions 234 for upper-electrode lead-out wiring 214 (see FIGS. 6A and 6B), and FIG. 5H is a sectional view taken along line 5H-5H in FIG. 4H.

In the next step, upper electrode 207 is formed. The resist formed in the step shown in FIG. 5H is removed from the substrate. Thereon, Al, for example, is vapor-deposited, and on the Al-deposited face, a resist pattern for the upper electrode is formed by photolithography. Finally, the Al is dry-etched through this resist pattern as the mask to form upper electrode 207. FIG. 4I is a plan view after formation of the upper electrode, and FIG. 5I is a sectional view taken along line 5I-5I in FIG. 4I.

Figure 5I:
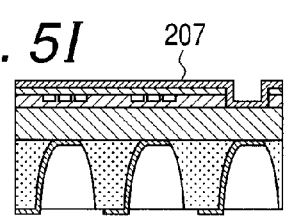
Figure 5J:
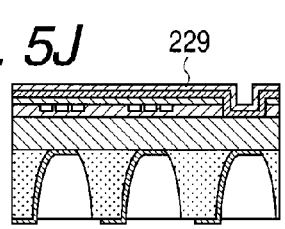

The resist formed as illustrated in FIG. 5I is removed. Thereafter, for separating the lower electrodes for the respective elements, resist 229 is formed by photolithography. FIG. 4J is a plan view after formation of the pattern of resist 229, and FIG. 5J is a sectional view taken along line 5J-5J in FIG. 4J.

Figure 5K:
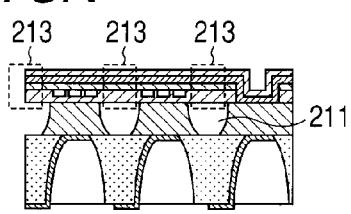

In the next step, grooves 211 are formed on Si substrate 208. FIG. 4K is a plan view after formation of grooves 211, and FIG. 5K is a sectional view taken along line 5K-5K in FIG. 4K. Si substrate 208 is dry-etched through resist 229 as the mask formed in the step illustrated in FIG. 5J. The dry etching is conducted isotropically by use, for example, of a $SF_6$ of $XeF_2$. Si remaining under beam 213 will interrupt the insulation between the elements. Therefore, the etching gas is introduced into the grooves (portions not covered with resist 229) to etch the Si substrate under beam 213. Thus the portions of the lower electrode under beam 213 as illustrated FIG. 5K are removed through the grooves. After formation of the grooves, the resist used as the mask is removed by washing with a solvent like acetone and isopropyl alcohol (IPA).

Figure 5L:
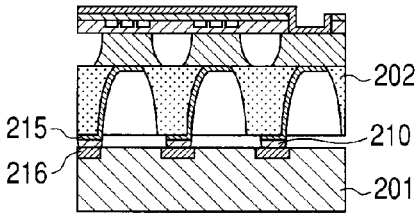

In the final step, Pyrex® substrate 202 and circuit substrate 201 are bonded together. FIG. 4L is a plan view after bonding of the circuit substrate, and FIG. 5L is a sectional view taken along line 5L-5L in FIG. 4L. The bonding is conducted by use of a lead-free solder by reflowing. For the soldering, a solder paste, a blend of a powdery solder and a flux, is applied by printing to electrode pads 216 of circuit substrate 201. Electrode pads 216 of circuit substrate 201 and lower electrode pads 215 are registered positionally and the substrates are bonded together by the solder 210. The obtained conversion device is capable of emitting and receiving ultrasonic signals.

Figure 6A:
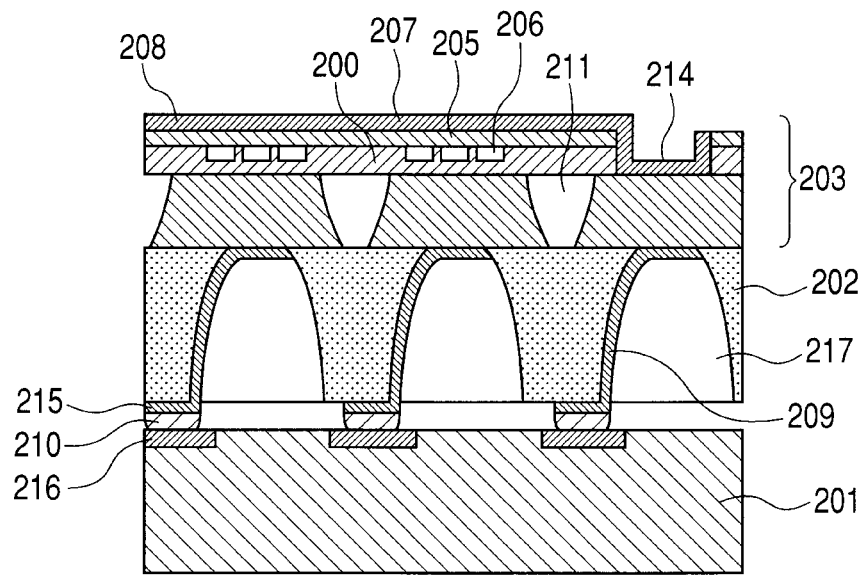
FIGS. 6A and 6B are schematic views of the CMUT of Embodiment 1.
Figure 6B:
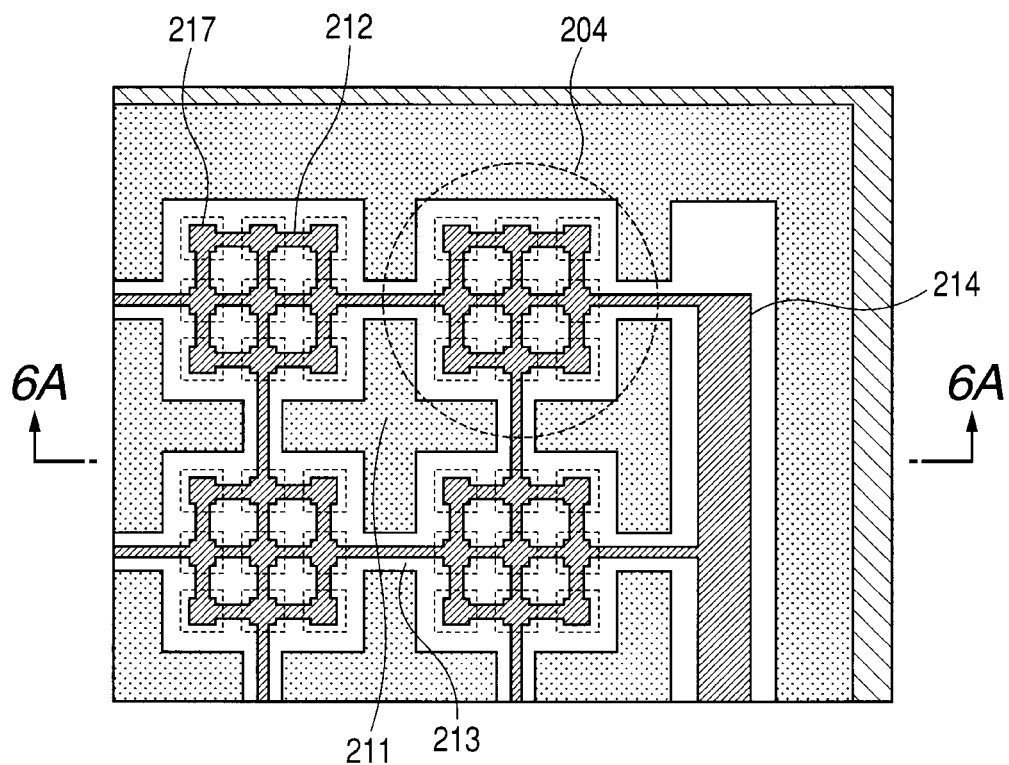

FIGS. 6A and 6B illustrate the structure of the CMUT produced on substrate 201 in the above process. FIG. 6A is a sectional view taken along line 6A-6A in FIG. 6B, and FIG. 6B is a plan view of the CMUT produced in this Embodiment. Lower electrodes 208 correspond one-to-one to through-holes 217. At the bonding face between the Si substrate as the lower electrodes and the Pyrex® substrate as the connection substrate, the grooves for separating the lower electrodes and the through-holes of the Pyrex® substrate are shifted from each other in the horizontal direction, whereby all the grooves are shut by the Pyrex® substrate.

In this Embodiment, the CMUT having lower electrodes separated by grooves is bonded to a connection substrate. In this CMUT, the connection substrate functions as a reinforcing member to improve the mechanical strength of the CMUT. Further, the grooves are formed after bonding of the connection substrate, so that the element substrate is less liable to be broken.

Embodiment 2

This Embodiment 2 describes another process for producing the CMUT described in Embodiment 1. The process flow of this Embodiment is described with reference to FIGS. 7A to 7M. FIGS. 7A to 7M are sectional views of only two elements for the description, but the other elements are produced in the same manner.

In the process flow of the Embodiment 2, the steps illustrated in FIGS. 7A to 7D are the same as those of the process flow illustrated in FIGS. 5A to 5D in Embodiment 1. Therefore the description thereof is omitted here.

After the step illustrated in FIG. 7D, groves are formed. FIG. 7E is a sectional view after formation of the grooves. On Si substrate 308 which has been made thin in the step illustrated in FIG. 7D, resist pattern 324 is formed by photolithography. Then grooves 311 are formed through an etching mask of resist 324 by deep-RIE. The etching is controlled not to cause penetration through the Si substrate 308 because, in the next step, a voltage is applied to tips of the elements for anode bonding of Si substrate 308 to Pyrex® substrate 302. For this voltage application, the grooves should not penetrate the lower electrode. In the present disclosure, the wording "formation of the grooves not to penetrate through the lower electrode" signifies that the depth of the groove is in the range from 50% to 90% of the thickness of the lower electrode.

After the above steps, from the step of bonding of the Pyrex® substrate to the step of the photolithography on the membrane side for separating the lower electrodes for the respective elements, the process flow is the same as in Embodiment 1. That is, the process flow illustrated in FIGS. 7F to 7K is the same as that in FIGS. 5E to 5J. Therefore the description thereof is omitted.

In the next step, the residue of the Si substrate remaining unetched in formation of the grooves in the step of FIG. 7E is etched off for insulation between the elements. FIG. 7L is a sectional view after the completion of the grooves. In this etching step, in the same manner as in Embodiment 1, the Si substrate is dry-etched through resist 329 formed in the step of FIG. 7K as the etching mask. The dry etching is conducted isotropically by use, for example, of a $SF_6$ or $XeF_2$ gas. Since Si remaining under beam 313 will interrupt the insulation between the elements, the Si substrate under beam 313 is etched by introduction of the etching gas through the grooves (portions not covered with resist 329). After completion of the grooves, resist 229 used as the mask is removed by washing with a solvent like acetone and IPA.

In the final step, circuit substrate 301 is bonded to Pyrex® substrate 302. FIG. 7M is a sectional view after bonding of the circuit substrate. The bonding is conducted, for example, by use of a lead-free solder by reflowing. For the soldering, a solder paste, which is a blend of a powdery solder and a flux, is applied by printing onto electrode pads 316 of circuit substrate 301. Electrode pads 315 of circuit substrate 301 and lower electrode pads 316 are registered positionally, and the substrates are bonded together by the solder 310. The resulting conversion device is capable of emitting and receiving ultrasonic signals. Specific description of the upper electrodes 307, the through-holes 317, the oxidization film 321, the SOI substrate 323 and the portions 334 for the lead-out wiring in this embodiment is not provided.

In Embodiment 1, the grooves are formed in the Si substrate in the later step in the process by isotropic dry etching. Therefore the Si substrate is etched also in the horizontal direction in the same distance as the depth of the grooves. This results in smaller sectional areas of the lower electrode to make smaller the lower-electrodes and to make smaller the elements, limiting the number of the cavities. In contrast, in this Embodiment 2, not to limit the number of the cavities, the grooves are formed in an earlier step of the process not to penetrate the Si substrate with small portions of the Si substrate left unetched. The groove can be formed with high perpendicularity by deep-RIE. In the last step, the remaining Si substrate is removed by isotropic etching to insulate electrically the elements from each other. Thereby the amount of the isotropic dry-etching is decreased in comparison with the process in Embodiment 1, and the effective area of the lower electrodes can be maximized. Further, since the lower electrodes do not penetrate before bonding of the connection substrate, the lower electrodes and the connection substrate can be bonded by anode bonding method. In other words, before bonding of the connection substrate, the entirety of the lower electrodes are electrically conductive, and the lower electrodes and the connection substrate can be bonded by application of a voltage.

Embodiment 3

Figure 8A:
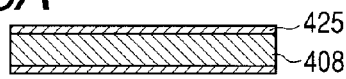
FIGS. 8A, 8B, 8C, 8D, 8E, 8F, 8G, 8H, 8I, 8J, 8K, 8L and 8M are sectional views for describing a process for production of the CMUT of Embodiment 3.

Embodiment 3 describes a CMUT having a membrane prepared by micromachining, and a process for producing the CMUT. The process flow of this Embodiment is described with reference to FIGS. 8A to 8M. FIGS. 8A to 8M are sectional views of only two elements for the description, but the other elements can be produced in the same manner A Si substrate 408 is prepared firstly. The Si substrate has preferably a lower resistivity for the later use as the lower electrodes. In this embodiment, the Si substrate has a resistivity lower than 0.02 Ω·cm. Then a silicon nitride film 425 is formed on Si substrate 408 by plasma-enhanced chemical vapor deposition (PECVD). This film protects the Si substrate for the lower electrodes in the later etching of the subsequently formed sacrificing layer. FIG. 8A is a sectional view after formation of the silicon nitride film.

Figure 8B:

In the next step, a sacrificial layer is formed. In this Embodiment, an amorphous silicon film is formed by PECVD. Then a pattern of the sacrificial layer is formed by photolithography. The amorphous silicon is etched by reactive ion etching (RIE) to form patterned sacrificial layer 430. The amorphous silicon has a thickness, for example, of 0.1 µm. FIG. 8B is a sectional view after formation of sacrificial layer 430.

Figure 8C:
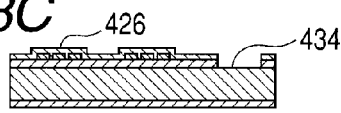

Next, a first membrane and upper-electrode lead-out wiring are formed. FIG. 8C is a sectional view after formation of the upper-electrode lead-out wiring. Thereon, silicon nitride film 426 is formed in a thickness, for example, of 0.6 µm by PECVD. Then regions 434 for the upper-electrode lead-out wiring are patterned by photolithography and RIE.

Figure 8D:
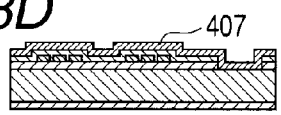

In the next step, an upper electrode is formed. For example, an Al film is formed in a thickness of 120 nm, and thereon a Cr film is formed in a thickness of 30 nm. Then a resist pattern for the upper electrode is formed thereon by photolithography. The Al and the Cr are wet-etched through this resist pattern as the mask to form upper electrode 407. FIG. 8D is a sectional view after formation of the upper electrode.

Figure 8E:
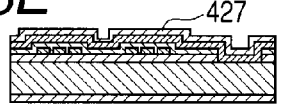

In the next step, a second membrane is formed. For example, silicon nitride film is formed in a thickness of 0.6 µm by PECVD. This second membrane 427 protects the upper electrode against etching in the etching of the sacrificing layer. FIG. 8E is a sectional view after formation of the second membrane.

Figure 8F:
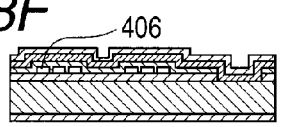

In the next step, cavities are formed. In this step, the second membrane is etched by RIE to form etching holes for etching of sacrificing layer (in FIG. 9B, etching hole is denoted by the numeral 440). The etching holes communicate with patterned sacrificial layer 430. For the etching, the substrate is immersed in a tetramethyl ammonium hydroxide (TMAH) solution to etch the amorphous silicon of the sacrificial layer through the etching hole with the TMAH. Thereby cavities 406 are formed. FIG. 8F is a sectional view after etching of the sacrificial layer.

Figure 8G:
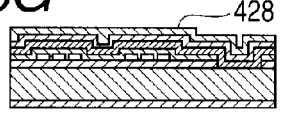

Next, the etching holes are sealed by forming, for example, a silicon nitride film 428 in a thickness of 0.45 µm. FIG. 8G is a sectional view after the sealing of the etching holes.

Figure 8H:
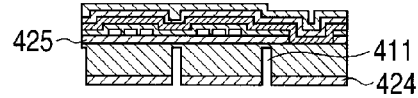

In the next step, grooves are formed. FIG. 8H is a sectional view after formation of the grooves. In this step, on Si substrate 408, resist pattern 424 is formed by photolithography, and then grooves 411 are formed by deep-RIE with resist 424 as the etching mask. In the formation of grooves 411, the etching is controlled so as not to penetrate through Si substrate 408 (the depth of the grooves ranging from 50% to 90% of the thickness of the Si substrate). The etching is stopped before the groove reaches silicon nitride film 425 to enable application of a voltage to the tip of the elements for the anode bonding of Si substrate 408 to Pyrex® substrate in the next step.

Figure 8I:
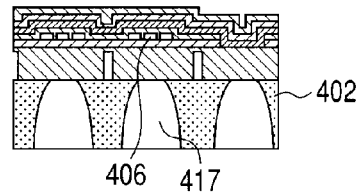

In the next step, a connection substrate is bonded thereto. FIG. 8I is a sectional view after the bonding of Pyrex® glass substrate as the connection substrate. Pyrex® substrate 402 is bonded to silicon substrate 408 by anode bonding. Through Pyrex® substrate 402, through-holes 417 are formed preliminarily by sand blasting or a like method. For electric connection by the through-wiring, the through-holes and the elements are positionally registered to have the center axes at the same position. The registration can be made with precision of at least ±5 µm by a conventional alignment apparatus (e.g., EVG620 produced by EVG Co.).

Figure 8J:
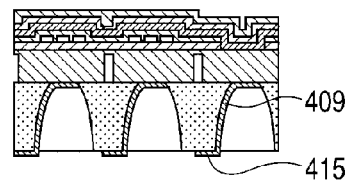

In the next step, lower-electrode lead-out wiring and lower electrode pads are formed in and on the Pyrex® substrate. FIG. 8J is a sectional view after formation of the lower-electrode lead-out wiring and the lower electrode pads. Lower-electrode lead-out wiring 409 and lower electrode pads 415 are formed in a film shape by vapor deposition of, for example, Ti/Cu/Au at an angle of 45' relative to the center axes of through-holes 417 in the same manner as in Embodiment 1 not to cause disconnection at the corner portions of through-holes 417. In this vapor deposition, a metal mask having a pattern of the lower-electrode lead-out wiring and the lower electrode pads is placed on the front face of Pyrex® substrate 402. Thereby, lead-out wiring 409 and lower electrode pads 415 are formed in and on the Pyrex® substrate.

Figure 8K:
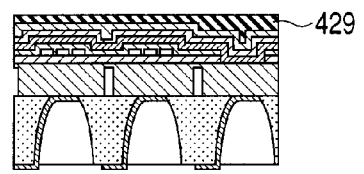

In the next step, resist pattern 429 is formed for separating the lower electrodes. FIG. 8K is a sectional view after formation of the resist pattern.

Figure 8L:
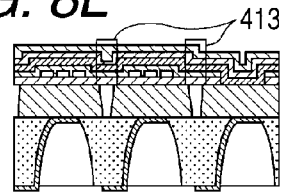

In the next step, the residue of Si substrate 408 left unetched after formation of the grooves in the step of FIG. 8H is etched off to insulate the elements from each other in the same manner as in Embodiment 2. FIG. 8L is a sectional view after the completion of the grooves. In this etching step, Si substrate 408 is dry-etched through resist 429 formed in the step of FIG. 8K as the etching mask. The dry etching is conducted isotropically by use, for example, of a $SF_6$ gas. Since Si remaining under beam 413 will interrupt the insulation of the elements, the Si substrate under beam 413 is etched by introduction of the etching gas through the grooves (portions not covered with resist 429). That is, the portions of the lower electrode under beams 413, as illustrated in FIG. 9B, is removed through the grooves. After completion of the grooves, the resist used as the mask is removed by washing with a solvent like acetone and IPA.

Figure 8M:
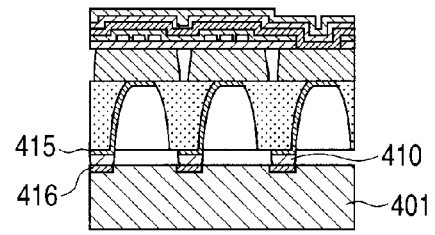

In the final step, Pyrex® substrate 402 and circuit substrate 401 are bonded together as illustrated in FIG. 8M, a sectional view. The bonding is conducted, for example, by use of a lead-free solder by reflowing. For the soldering, a solder paste, which is a blend of a powdery solder and a flux, is applied by printing onto lower-electrode pads 415 on Pyrex® substrate 402. Electrode pads 416 of circuit substrate 401 and lower electrode pads 415 formed on the Pyrex® substrate are registered positionally, and the substrates are bonded together by solder 410. The resulting conversion device is capable of emitting and receiving ultrasonic signals.

Figure 9A:
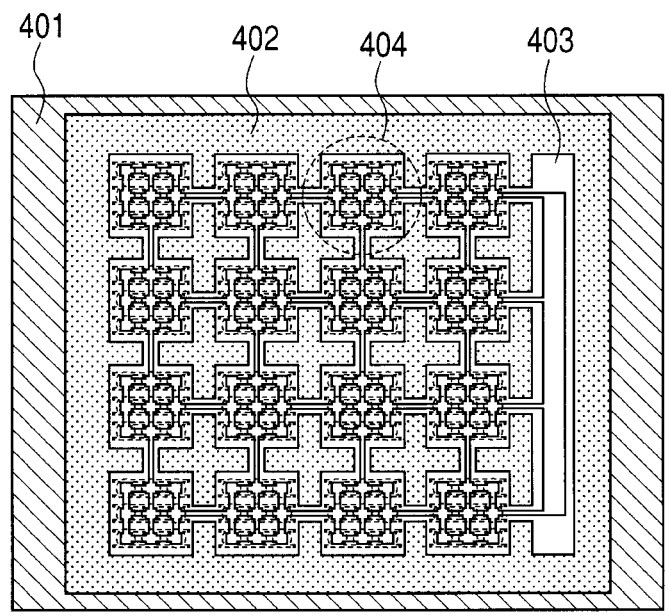
FIGS. 9A and 9B are schematic views of the CMUT of Embodiment 3.
Figure 9B:
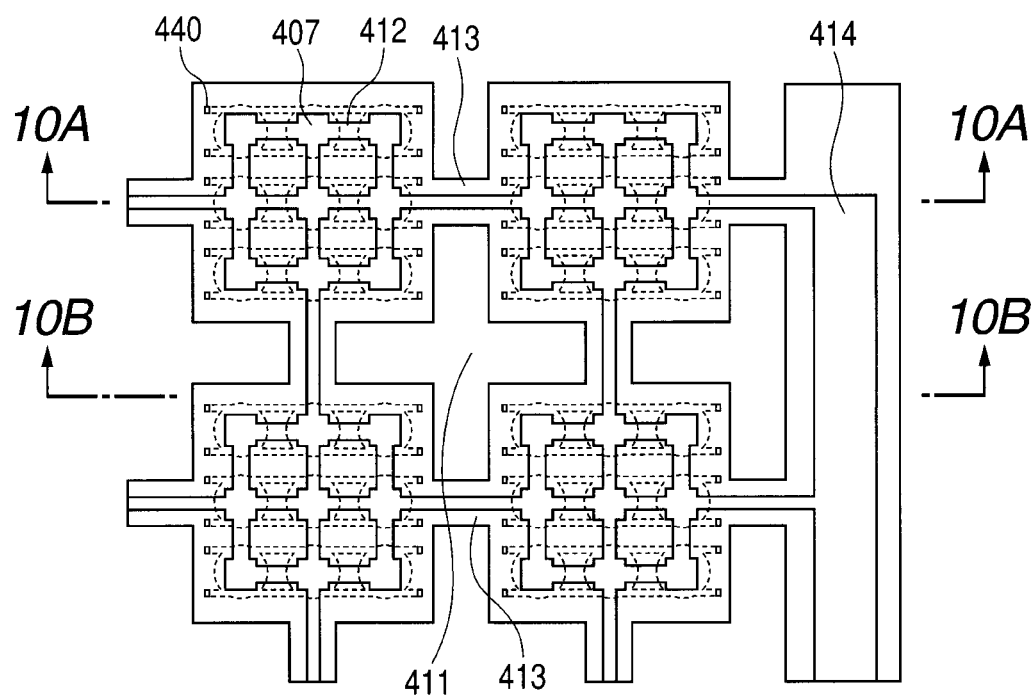
Figure 10A:
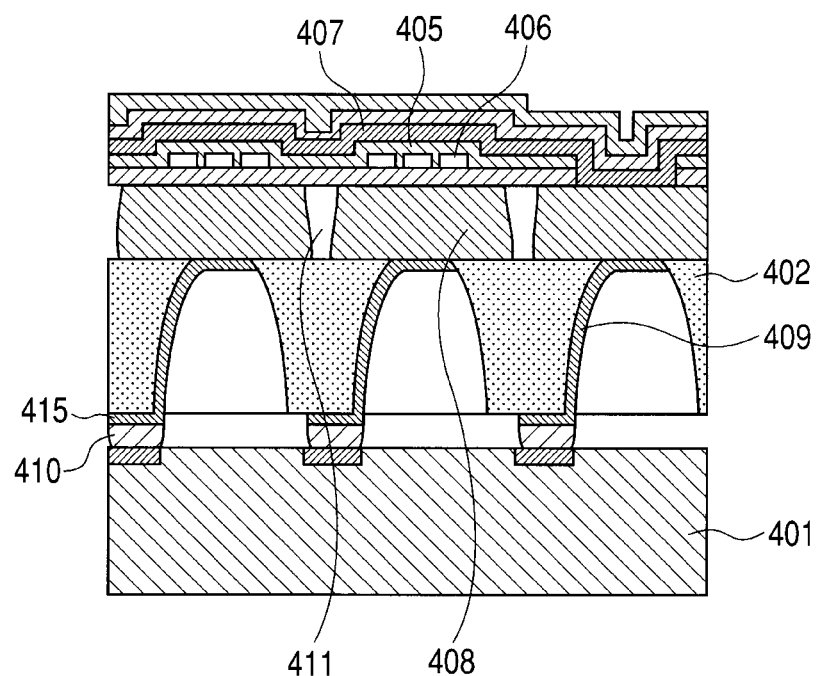
FIGS. 10A and 10B are plan views of the CMUT of Embodiment 3.
Figure 10B:
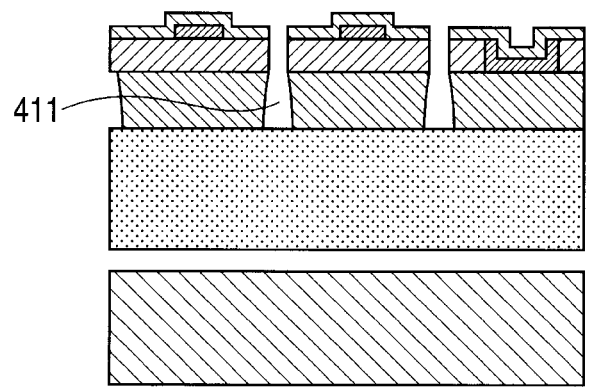

FIGS. 9A to 9B, and FIGS. 10A to 10B illustrate the structure of the CMUT produced through the above process, indicating the dimensions of the parts. FIG. 9A is a plan view, and FIG. 9B is a schematic expanded drawing of a part of FIG. 9A. FIG. 10A is a sectional view taken along line 10A-10A in FIG. 9B, and FIG. 10B is a sectional view taken along line 10B-10B.

In this Embodiment, the CMUT having lower electrodes separated by grooves is bonded to a connection substrate. In this CMUT, the connection substrate functions as a reinforcing member to improve the mechanical strength of the CMUT.

Embodiment 4

In this Embodiment 4, before a connection substrate with an SOI substrate is bonded to lower electrodes, grooves are formed to penetrate the lower electrode layer to separate the lower electrodes. A print substrate is used as the connection substrate. FIGS. 11A to 11L illustrates the process for producing a CMUT.

The process flow of this Embodiment is described with reference to FIGS. 11A to 11L. FIGS. 11A to 11L are sectional views of only two elements for description, but the other elements can be produced in the same manner.

In the process flow of this Embodiment 4, the steps illustrated in FIGS. 11A to 11D are the same as the process flow illustrated in FIGS. 5A to 5D in Embodiment 1. Therefore the description thereof is omitted.

Figure 11A:
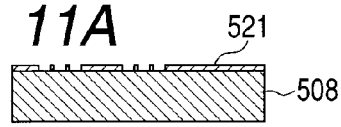
FIGS. 11A, 11B, 11C, 11D, 11E, 11F, 11G, 11H, 11I, 11J, 11K and 11L are sectional views for describing a process for production of the CMUT of Embodiment 4.
Figure 11B:
Figure 11C:
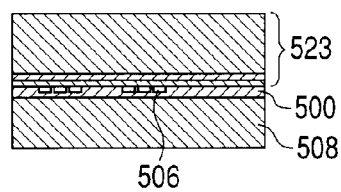
Figure 11D:
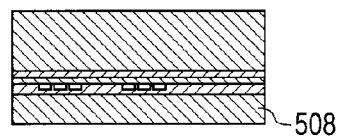
Figure 11E:
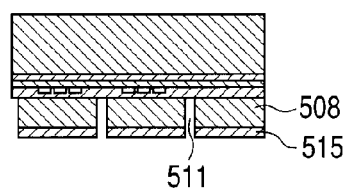

After the step illustrated in FIG. 11D, grooves are formed. FIG. 11E is a sectional view after formation of the grooves. In this step, on thinned Si substrate 508 in the step illustrated in FIG. 11D, a resist pattern is formed by photolithography. Then, grooves 511 are formed by deep-RIE through the resist as the etching mask. Further, lower electrode pads 515 are formed, for example, by vapor deposition of Ti/Cu/Au with a lattice-shaped metal mask placed before the front face of Si substrate 508 so as not to cause the vapor deposition in groove 511.

Figure 11F:
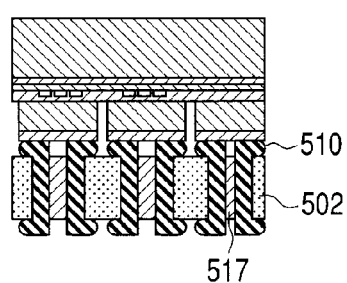

In the next step, a print substrate is bonded thereto. FIG. 11F is a sectional view illustrating the print substrate. Print substrate 502 has through-holes 517. Print substrate 502 is bonded to Si substrate 508 by solder 510. Solder 510 reaches, along the side faces of through-holes 517, the reverse face of print substrate 502. Thereby, electric connection with the circuit substrate can be made in the later step. Thus in this Embodiment, lower electrode pad 515 and solder 510 functions as the wirings. The bonding by the solder is conducted by applying a load onto Si substrate 508 for temporary bonding with print substrate 502 and by reflowing for complete bonding.

Figure 11G:
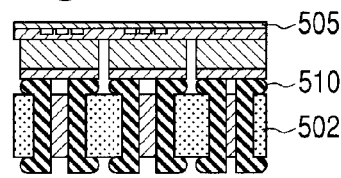

In the next step, the supporting substrate layer of SOI substrate 523 and the embedded oxidized film layer are removed by etching. The supporting substrate layer of SOI substrate 523 is made thin by grinding. Then the remaining Si substrate is etched off by use of KOH, or by use of TMAH. In this etching, to protect solder 510 and print substrate 502 against the etching by KOH, a jig made of material sold under the name Teflon® (not shown in the drawings) is preferably used. Similarly the embedded oxidized film layer can be etched off by BHF. Thereby membrane 505 is formed. FIG. 11G is a sectional view after etching removal of the supporting substrate layer of SOI substrate 523 and the embedded oxidized film layer.

Figure 11H:
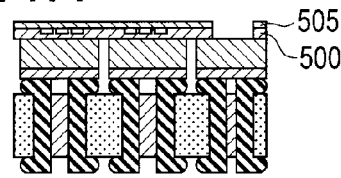

In the next step, upper-electrode lead-out electrode 515 is formed. In this step, a resist pattern for formation of the upper-electrode lead-out electrode is prepared on the membrane formed in the step of FIG. 11G. With this resist as the mask, membrane 505 is dry-etched, for example with a $CF_4$ gas or a $SF_6$ gas. In the same manner, oxidized film 521 is dry-etched by a $CF_4$ gas or a $CHF_3$ gas through the resist. FIG. 11H is a sectional view after the formation of the upper-electrode lead-out electrode.

Figure 11I:
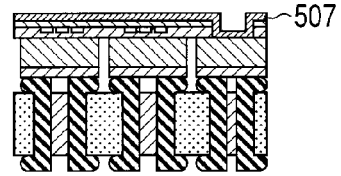

In the next step, the upper electrode is formed. In this step, after removal of the resist formed in the step of FIG. 11H, Al, for example, is vapor deposited thereon. On the face on which Al is vapor-deposited, a resist pattern for the upper electrode is formed by photolithography. Finally the Al is wet-etched through the resist pattern as a mask to form upper electrode 507. FIG. 11I is a sectional view after the formation of the upper electrode.

Figure 11J:
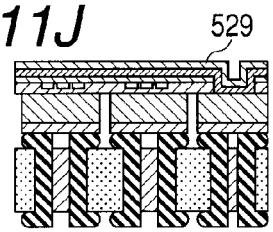

In the next step, after the resist formed in the step of FIG. 11I is removed, another resist pattern is formed for separation of the lower electrodes for the respective elements. FIG. 11J is a sectional view after formation of resist 529.

Figure 11K:
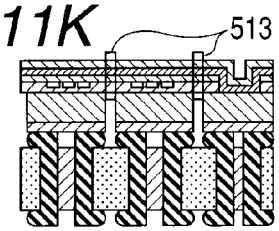

In the next step, membrane 505 and oxidized film 521 are etched through resist 529 as the etching mask. FIG. 11K is a sectional view after formation of the elements. This sectional view is taken at the portion of beam 513, so that it does not illustrate the etched portions. However, the peripheries of the upper-electrode lead-out wires, membrane on the portion excluding beam 513 and the elements, and the oxidized film are etched off. The etching is conducted, for example, by dry-etching with a $CF_4$ gas, a $SF_6$ gas, and a $CHF_3$. After the etching the resist which has been used as the etching mask is removed by washing with acetone, isopropyl alcohol (IPA) or a like solvent.

Figure 11L:
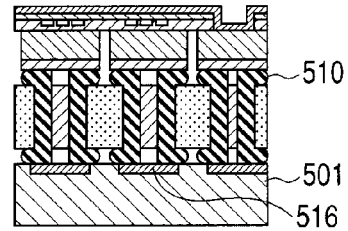
Figure 12:
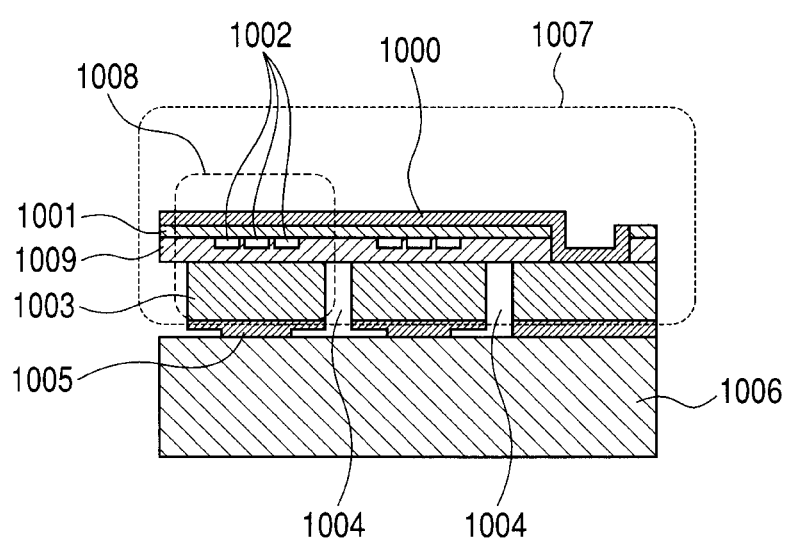
FIG. 12 is a schematic drawing for describing a conventional CMUT.

In the final step, print substrate 502 is bonded to circuit substrate 501 by use of a solder 510. FIG. 11L is a sectional view after bonding to the circuit substrate. For the bonding, a solder paste is printed on electrode pad 516 of circuit substrate 501. Electrode pads 516 of circuit substrate 501 and the solder 510 on print substrate 502 are positionally registered and are bonded by solder reflowing. The resulting conversion device is capable of processing signals of ultrasonic wave.

In this Embodiment, grooves are formed to penetrate the lower electrodes before the step of bonding the connection substrate to the lower electrodes. In such a method, the grooves can be formed by etching from one side with high perpendicularity. Further with the grooves formed, supporting substrate layer and the embedded oxidized film layer support the element substrate, not to cause excessive loading in bonding of connection substrate.

Embodiment 5

In this Embodiment 5, a through-wiring substrate of glass is employed as the connection substrate. FIGS. 13A to 13L are drawings for illustrating the process for producing a CMUT.

The process flow of this Embodiment is described with reference to FIGS. 13A to 13L. FIGS. 13A to 13L are sectional views of two elements for the describing the process flow, the other elements being produced in the same manner. In the process flow of the Embodiment 5, the steps illustrated in FIGS. 13A to 13D are the same as those of the process flow illustrated in FIGS. 5A to 5D in Embodiment 1. Therefore the description of FIGS. 13A to 13D is omitted.

Figure 13A:
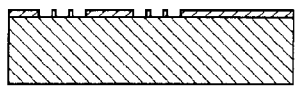
FIGS. 13A, 13B, 13C, 13D, 13E, 13F, 13G, 13H, 13I, 13J, 13K and 13L are sectional views for describing a process for production of the CMUT of Embodiment 5.
Figure 13B:
Figure 13C:
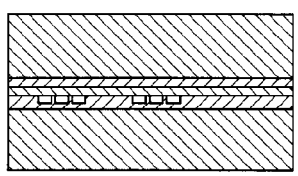
Figure 13D:
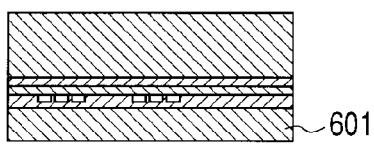
Figure 13E:
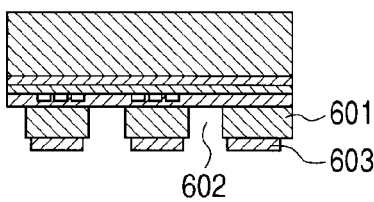

Next to the step illustrated in FIG. 13D, grooves are formed as illustrated in the sectional view FIG. 13E. On Si substrate 601 thinned in the preceding step of FIG. 13D, a resist pattern is formed by photolithography. Then, grooves 602 are formed through the resist pattern as the etching mask by deep-RIE. Then, lower electrode pads 603 are formed, for example, by vapor deposition of Ti/Au through a lattice-shaped metal mask placed before the front face of Si substrate 601 not to cause the vapor deposition in grooves 602.

Figure 13F:
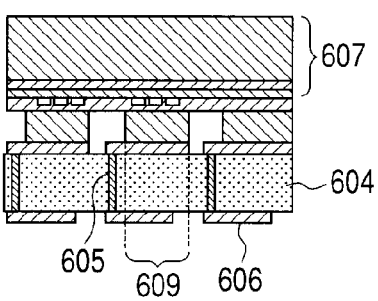
Figure 13G:
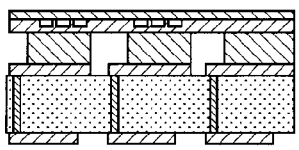
Figure 13H:
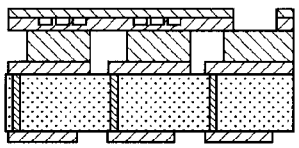
Figure 13I:
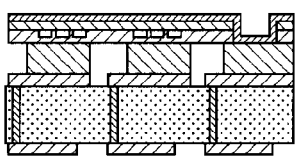
Figure 13J:
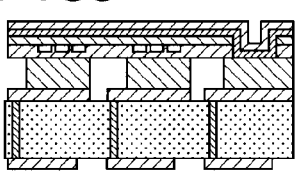
Figure 13K:
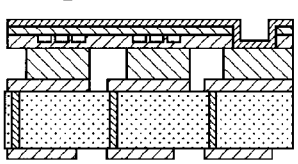
Figure 13L:
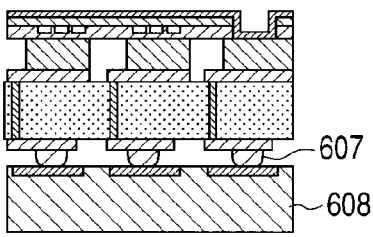

In the next step, a glass through-wiring substrate is bonded thereto. FIG. 13F is a sectional view illustrating the state of bonding of Si substrate 601 to the glass through-wiring substrate. Glass through-wiring substrate 604 is a substrate made of borosilicate glass having through-wiring 605 made of tungsten, or an alloy of Fe, Ni, and Co. On the glass through-wiring substrate, Ti/Au (not shown in the drawings) is formed corresponding to the pattern of Ti/Au on the Si substrate. Si substrate 601 and glass through-wiring substrate 604 are fixed together by Au—Au bonding. In this bonding, through-wirings 605 should be placed outside regions 609 below the lower electrode. On the reverse face of glass through-wiring substrate 604, under-bump metal members 606 are formed. Therewith, in the later step of the production, glass through-wiring substrate 604 and circuit substrate 608 are bonded by a solder for electric connection between the element substrate and the circuit substrate. Thus, in this Embodiment, lower electrode pads 603 and solder 607 functions as the wiring.

In the process flow of the Embodiment 5, the steps illustrated in FIGS. 13G to 13L are the same as those of the process flow illustrated in FIGS. 11G to 11L in Embodiment 4. Therefore the description thereof is omitted.

In this Embodiment, grooves are formed to penetrate the lower electrodes before the step of bonding the connection substrate to the lower electrodes. In such a method, the grooves can be formed by etching from one side with high perpendicularity. Further, with the grooves formed, supporting substrate layer and the embedded oxidized film layer support the element substrate, so as not to cause excessive loading in bonding of the connection substrate.

In this Embodiment, the thermal expansion coefficient of the element substrate is close to that of the connection substrate (silicon: 2.55-4.33 ppm/K; borosilicate glass: 3.2-5.2 ppm/K). Therefore, the stress caused between the substrates by thermal expansion difference is slight, which prevents variation of ultrasonic signal receiving sensitivity by membrane stress caused by warpage of the element substrate.

Further, in this Embodiment, since the wiring provided in the through-holes are not coaxial with the lower electrodes, the lower electrodes and the connection substrate will not be split and the wirings are not broken even when a volume change is caused in the through-wirings by the high temperature that occurs in the production process.

The conversion device of this Embodiment has high environmental resistance owing to the Au—Au bonding of the element substrate to the connection substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electromechanical conversion device comprising:
an element substrate including a plurality of elements, each of said elements having a first electrode, a second electrode, and a support disposed on said first electrode so as to interpose a gap between said first electrode and said second electrode;
a circuit substrate; and
an insulating connection substrate configured to fix said element substrate and said circuit substrate, said connection substrate being provided with wiring,
wherein said first electrode and said circuit substrate are connected electrically by said wiring.

2. The electromechanical conversion device according to claim 1, further comprising:
a membrane supported by said support,
wherein said second electrode is disposed on said membrane.

3. The electromechanical conversion device according to claim 2, wherein said support and said membrane are disposed on said first electrode, and a groove separates respective ones of said first electrodes of each of said elements.

4. The electromechanical conversion device according to claim 3, wherein said groove is shut by said connection substrate where said first electrodes and said connection substrate are bonded together.

5. The electromechanical conversion device according to claim 1, wherein said connection substrate has a thickness that is in a range from 50 μm to 1000 μm.

6. The electromechanical conversion device according to claim 1, wherein said connection substrate has through-holes for said wiring.

7. The electromechanical conversion device according to claim 6, wherein said first electrodes are formed one-to-one for said through-holes.

8. The electromechanical conversion device according to claim 6, wherein said through-holes expand from said first face of said connection substrate toward a second face that is opposite from said first face.

9. The electromechanical conversion device according to claim 1, wherein said wiring and said first electrode are not coaxial.

10. The electromechanical conversion device according to claim 1, wherein said first electrodes are formed from a semiconductor material.

11. An electromechanical conversion device comprising:
a plurality of electromechanical conversion elements, each of said electromechanical conversion elements having a first electrode and a second electrode disposed above said first electrode so as to interpose a gap between said first electrode and said second electrode;
a circuit substrate; and
a connection substrate configured to fix said electromechanical conversion element and said circuit substrate, said connection substrate being provided with a plurality of wirings,
wherein said first electrodes of said elements and said circuit substrate are connected electrically by said wirings.

12. An electromechanical conversion device comprising:
a plurality of electromechanical conversion elements, each of said electromechanical conversion elements having a first electrode and a second electrode disposed above said first electrode so as to interpose a gap between said first electrode and said second electrode;
a circuit substrate; and
a connection substrate configured to fix said electromechanical conversion element and said circuit substrate, said connection substrate being provided with a plurality of wirings and a plurality of through-holes, and each of said through-holes having one of said wirings therein, wherein said first electrodes of said elements and said circuit substrate are connected electrically by said wirings.

13. The electromechanical conversion device according to claim 12, further comprising:
   a support; and
   a membrane supported by said support, on which said second electrode is disposed.

14. The electromechanical conversion device according to claim 12, wherein said first electrodes of said electromechanical conversion elements are isolated from each other.

15. The electromechanical conversion device according to claim 12, wherein said connection substrate has a thickness that is in a range from 50 μm to 1000 μm.

16. The electromechanical conversion device according to claim 12, wherein a common electrode includes said second electrodes.

17. The electromechanical conversion device according to claim 12, wherein said wiring and said first electrode of a given one of said elements are not coaxial.

18. The electromechanical conversion device according to claim 12, wherein at least one groove separates said first electrodes, said groove being shut by said connection substrate where said first electrodes and said connection substrate are bonded together.

19. The electromechanical conversion device according to claim 12, wherein said first electrodes are formed from a semiconductor material.

* * * * *